(12) United States Patent
Swanson et al.

(10) Patent No.: US 9,553,557 B2
(45) Date of Patent: Jan. 24, 2017

(54) POST-FILTER COMMON-GAIN DETERMINATION

(71) Applicants: Brett Anthony Swanson, Meadowbank (AU); Phyu Phyu Khing, North Sydney (AU)

(72) Inventors: Brett Anthony Swanson, Meadowbank (AU); Phyu Phyu Khing, North Sydney (AU)

(73) Assignee: Cochlear Limited, Macquarie University, NSW (AU)

( * ) Notice: Subject to any disclaimer, the term of this patent is extended or adjusted under 35 U.S.C. 154(b) by 0 days.

(21) Appl. No.: 14/854,268

(22) Filed: Sep. 15, 2015

(65) Prior Publication Data

US 2016/0049916 A1 Feb. 18, 2016

Related U.S. Application Data

(63) Continuation of application No. 13/658,074, filed on Oct. 23, 2012, now Pat. No. 9,166,546.

(60) Provisional application No. 61/550,907, filed on Oct. 24, 2011.

(51) Int. Cl.
| | | |
|---|---|---|
| *H03G 7/00* | (2006.01) | |
| *G10L 21/034* | (2013.01) | |
| *G10L 21/0316* | (2013.01) | |
| *H04R 25/00* | (2006.01) | |

(52) U.S. Cl.
CPC ............. *H03G 7/002* (2013.01); *G10L 21/034* (2013.01); *G10L 21/0316* (2013.01); *H04R 25/00* (2013.01); *H04R 25/505* (2013.01)

(58) Field of Classification Search
CPC .......................... H04R 25/505; G10L 21/0316
See application file for complete search history.

(56) References Cited

U.S. PATENT DOCUMENTS

| | | | |
|---|---|---|---|
| 3,894,195 A | | 7/1975 | Kryter |
| 4,617,913 A | | 10/1986 | Eddington |
| 4,701,953 A | | 10/1987 | White |
| 4,813,417 A | * | 3/1989 | Soli .......................... A61F 11/04 |
| | | | 607/56 |
| 4,823,795 A | * | 4/1989 | van den Honert . A61N 1/36032 |
| | | | 607/56 |

(Continued)

FOREIGN PATENT DOCUMENTS

| | | |
|---|---|---|
| WO | 00/08751 | 2/2000 |
| WO | 00/41298 | 7/2000 |
| WO | 02/13379 | 2/2002 |

OTHER PUBLICATIONS

International Search Report and Written Opinion for International Application No. PCT/182012/055832 mailed May 30, 2013 (12 pages).

(Continued)

*Primary Examiner* — Brian Albertalli
(74) *Attorney, Agent, or Firm* — Edell, Shapiro & Finnan, LLC

(57) ABSTRACT

An apparatus for processing an input sound signal, the apparatus including: gain circuitry configured to control a gain based on a plurality of respective sub-signals of the input sound signal; and an amplification apparatus configured to adjust the amplification of all the plurality of amplitudes based on the common gain.

23 Claims, 13 Drawing Sheets

(56) References Cited

U.S. PATENT DOCUMENTS

| | | | |
|---|---|---|---|
| 4,853,963 A * | 8/1989 | Bloy | H04B 1/66 381/106 |
| 4,887,299 A | 12/1989 | Cummins et al. | |
| 4,912,766 A | 3/1990 | Forse | |
| 5,029,217 A | 7/1991 | Chabries et al. | |
| 5,515,446 A * | 5/1996 | Velmer | H03G 9/18 333/14 |
| 5,724,433 A | 3/1998 | Engebretson et al. | |
| 5,832,097 A | 11/1998 | Armstrong et al. | |
| 5,903,655 A | 5/1999 | Salmi et al. | |
| 5,937,377 A | 8/1999 | Hardiman et al. | |
| 6,198,830 B1 * | 3/2001 | Holube | H03G 7/06 381/312 |
| 6,732,073 B1 * | 5/2004 | Kluender | G10L 15/02 704/200.1 |
| 6,873,709 B2 | 3/2005 | Hou | |
| 7,136,706 B1 | 11/2006 | Voelkel | |
| 7,796,770 B2 * | 9/2010 | Reber | H04R 25/505 381/320 |
| 8,019,105 B2 | 9/2011 | Kates | |
| 8,290,190 B2 * | 10/2012 | Hau | H04R 25/356 381/312 |
| 8,861,760 B2 * | 10/2014 | Strelcyk | H04R 25/356 381/321 |
| 2002/0076072 A1 | 6/2002 | Cornelisse | |
| 2002/0118851 A1 | 8/2002 | Paludan-Mueller | |
| 2007/0026829 A1 | 2/2007 | Kim et al. | |
| 2008/0144869 A1 | 6/2008 | Paludan-Mueller et al. | |
| 2011/0013791 A1 | 1/2011 | Griffin et al. | |
| 2012/0263329 A1 | 10/2012 | Kjeldsen et al. | |
| 2013/0103396 A1 | 4/2013 | Swanson et al. | |

OTHER PUBLICATIONS

Moore, Brian CJ, and Brian R. Glasberg. "Simulation of the effects of loudness recruitment and threshold elevation on the intelligibility of speech in quiet and in a background of speech." The Journal of the Acoustical Society of America 94.4 (1993) : 2050-2062.

White, M. W. "Compression systems for hearing aids and cochlear prostheses." Journal of rehabilitation research and development 23.1 ( 1986): 25-39.

Patrick, James F., Peter A. Busby, and Peter J. Gibson. "The development of the Nucleus® Freedom ™ cochlear implant system." Trends in amplification 10.4 (2006): 175-200.

Souza, Pamela E. "Effects of compression on speech acoustics, intelligibility, and sound quality." Trends in Amplification 6.4 (2002): 131-165.

Laizou, P. C. "Signal-p rocessing techniques for cochlear implants." Engineering in Medicine and Biology Magazine, IEEE 18.3 (1999): 34-46.

Schneider, Todd, and Robert Brennan. "A multichannel compression strategy for a digital hearing aid." Acoustics, Speech, and Signal Processing, 1997. ICASSP-97., 1997 IEEE International Conference on. vol. 1. IEEE, 1997.

Wilson, Blake S., et al. "Better speech recognition with cochlear implants." Nature 352.6332 (1991 ): 236-238.

Knapp, R. Benjamin, and Brent Townshend. "A real-time digital speech processing system for an auditory prosthesis." Acoustics, Speech, and Signal Processing. 1988. ICASSP-88., 1988 International Conference on. IEEE. 1988.

Cornelisse, Leonard E., Richard C. Seewald, and Donald G. Jamieson. "The input/output formula: A theoretical approach to the fitting of personal amplification devices." The Journal of the Acoustical Society of America 97.3 (1995): 1854-1864.

* cited by examiner

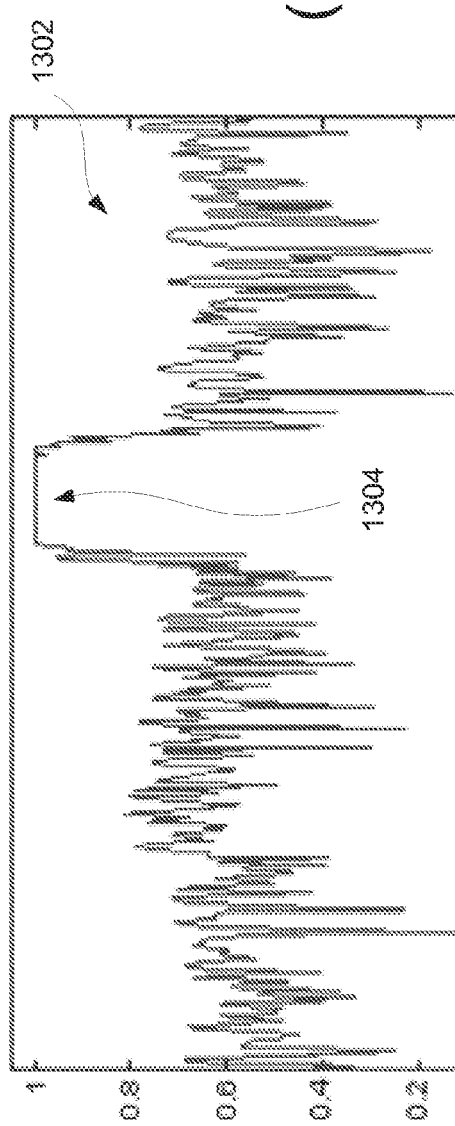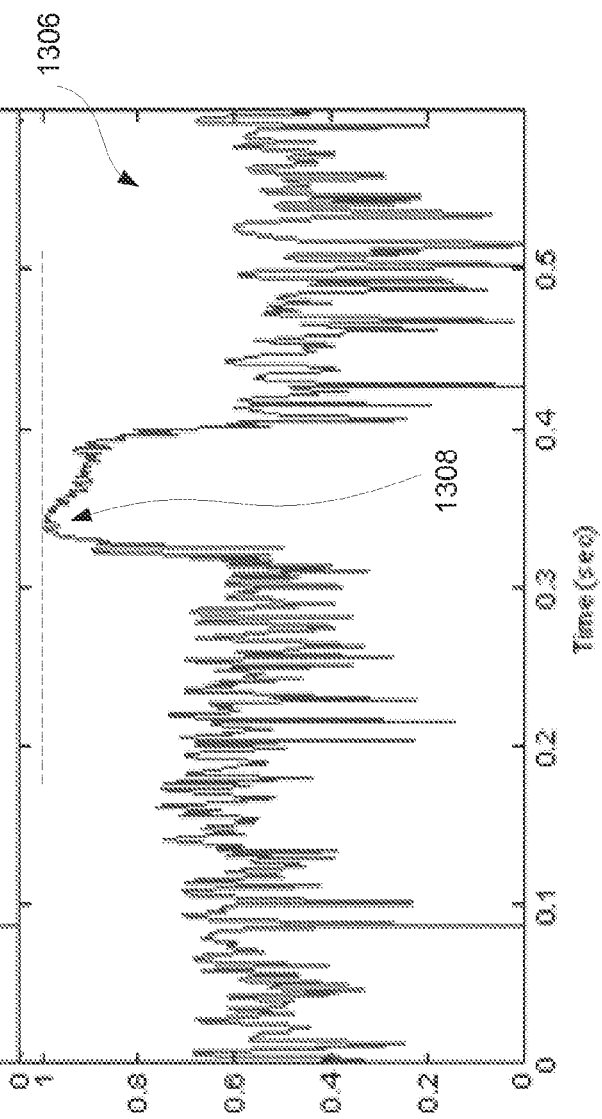

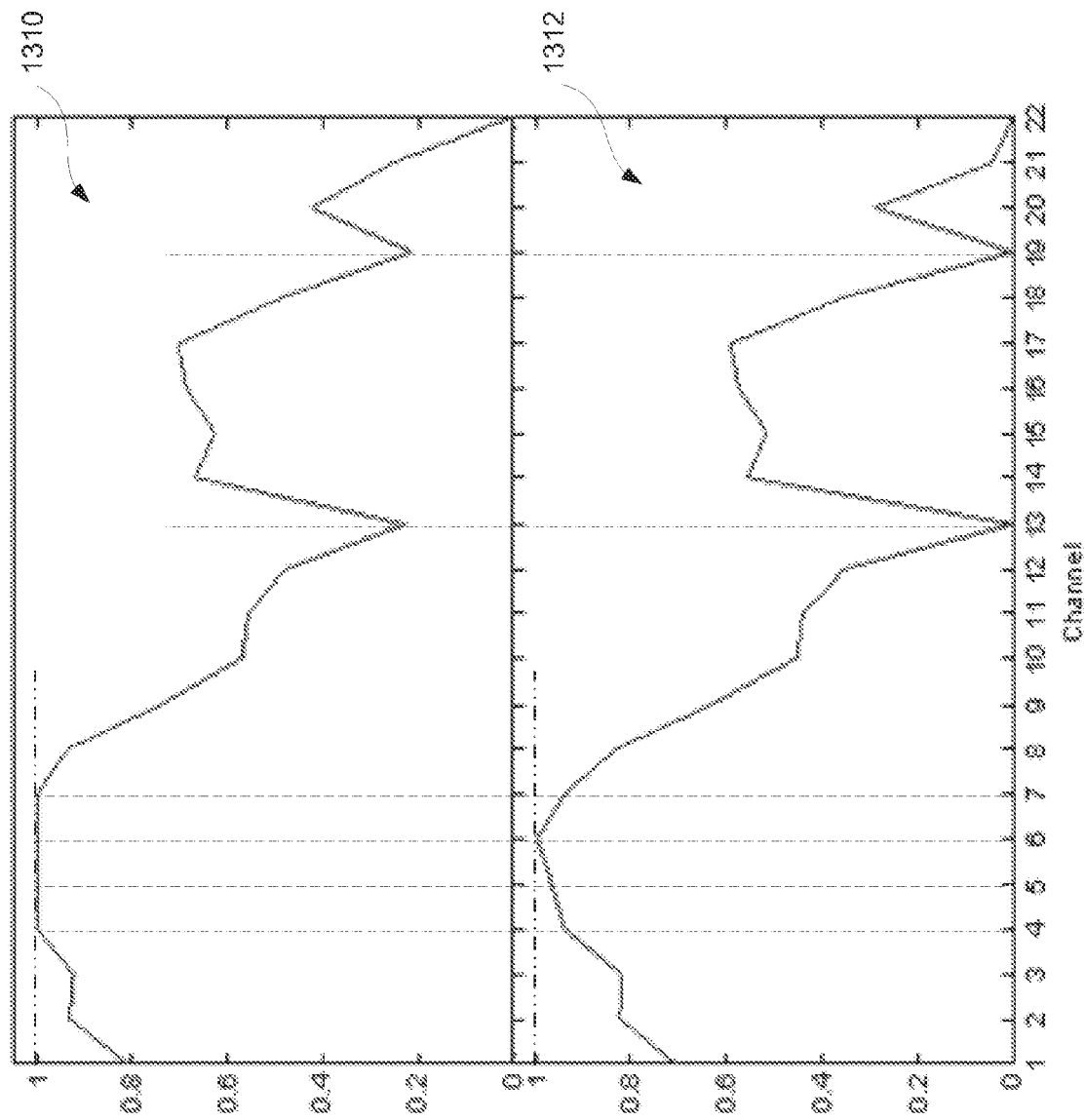

POST-FILTER COMMON-GAIN DETERMINATION

CROSS-REFERENCE TO RELATED APPLICATIONS

This application is a continuation application of U.S. Non-Provisional application Ser. No. 13/658,074, filed on Oct. 23, 2012, which claims priority to U.S. Patent Application No. 61/550,907, filed on Oct. 24, 2011

BACKGROUND

Field of the Invention

The present invention relates to post-filter processing of an input sound signal in order to adjust gain values. Such gain-control processing is applicable to hearing prostheses, telecommunications, and the like.

Related Art

Automatic Gain Control (AGC) systems are commonly used in audio processing systems (e.g., audio headsets, hearing prostheses, etc.) to cope with a large range in sound levels. In some systems, the audio signal is split into multiple frequency bands by a filter bank of discrete components or a transform (e.g., a Fast Fourier Transform). The gain of each band can then be controlled separately. This is referred to as a multi-band type of AGC.

A variety of hearing prostheses exist to assist people who suffer hearing loss. Some are entirely external devices, e.g., conventional hearing aids. Some hearing prostheses are implantable, and more particularly are examples of an active implantable medical device (AIMD). An AIMD is a medical device having one or more implantable components, the latter being defined as relying for its functioning upon a source of power other than the human body or gravity, such as an electrical energy source. Amongst hearing prostheses, an example of an AIMD is a cochlear implant system, which is used to treat sensorineural hearing loss by providing electrical energy directly to the recipient's auditory nerves via an electrode assembly implanted in the cochlea. Electrical stimulation signals are delivered directly to the auditory nerve via the electrode assembly, thereby inducing a hearing sensation (or percept) in the implant recipient.

When fitting a cochlear implant system to a recipient, the appropriate stimulation levels for each electrode must be determined. The lowest stimulation current that is perceptible is known as the threshold level or T level. The highest stimulation current that is comfortable is known as the maximum comfortable level or C level. The T and C levels vary between recipients, and also vary between electrodes in a single recipient.

The ratio between the C and T levels on an electrode is known as the electrical dynamic range, and is typically about 10 dB. This is much smaller than the dynamic range of sound levels in the environment, and hence the processing for a cochlear implant system generally incorporates some form of compression.

SUMMARY

In one aspect, an apparatus is provided. The apparatus comprises a frequency analysis unit configured to decompose a sound signal into a plurality of sub-signals each associated with a specific frequency band of the sound signal; amplitude detection circuits configured to produce provisional amplitudes for each of the sub-signals; gain circuitry configured to determine a common gain based on the provisional amplitudes; and an amplification module configured to generate a plurality of adjusted amplitudes by adjusting the amplification of all of the provisional amplitudes based on the common gain.

In another aspect, a method is provided. The method comprises generating provisional amplitude envelopes for a plurality of sub-signals that each comprise a frequency component of an input sound signal; generating, based on at least one gain rule, a common gain for application to each of the provisional amplitude envelopes; and applying the common gain to all of the provisional amplitude envelopes to produce a plurality of adjusted amplitude envelopes.

In another aspect, an apparatus is provided. The apparatus comprises a plurality of amplitude detectors configured to produce provisional amplitude envelopes for a plurality of sub-signals that each comprises a frequency component of an input sound signal; a level combiner configured to analyze the provisional amplitudes and generate a level signal; a gain rule module configured to generate a common gain based upon the level signal; and a bank of amplifiers configured to apply the common gain to the provisional amplitudes to generate adjusted amplitudes.

BRIEF DESCRIPTION OF THE DRAWINGS

Illustrative embodiments of the present invention are described herein in conjunction with the accompanying drawings, in which:

FIG. 3A illustrates a 0.6 second segment of the temporal waveform at the output of a Loudness Growth Function according to the Related Art;

FIG. 3B illustrates a 0.6 second segment of the temporal waveform at the output of a Loudness Growth Function according to the an embodiment of the present invention;

FIG. 3C illustrates a spectral profile at the output of a Loudness Growth Function according to the Related Art;

FIG. 3D illustrates a spectral profile at the output of a Loudness Growth Function according to the an embodiment of the present invention;

DETAILED DESCRIPTION

Embodiments of the present application are directed towards automatic gain control systems that feature post-filter (i.e., subsequent to bandpass filtering) gain generation, post-filter application of a common gain, and a static compression block configured with a maximum output level equal to a saturation level of a Loudness Growth Function.

Figure 1A:
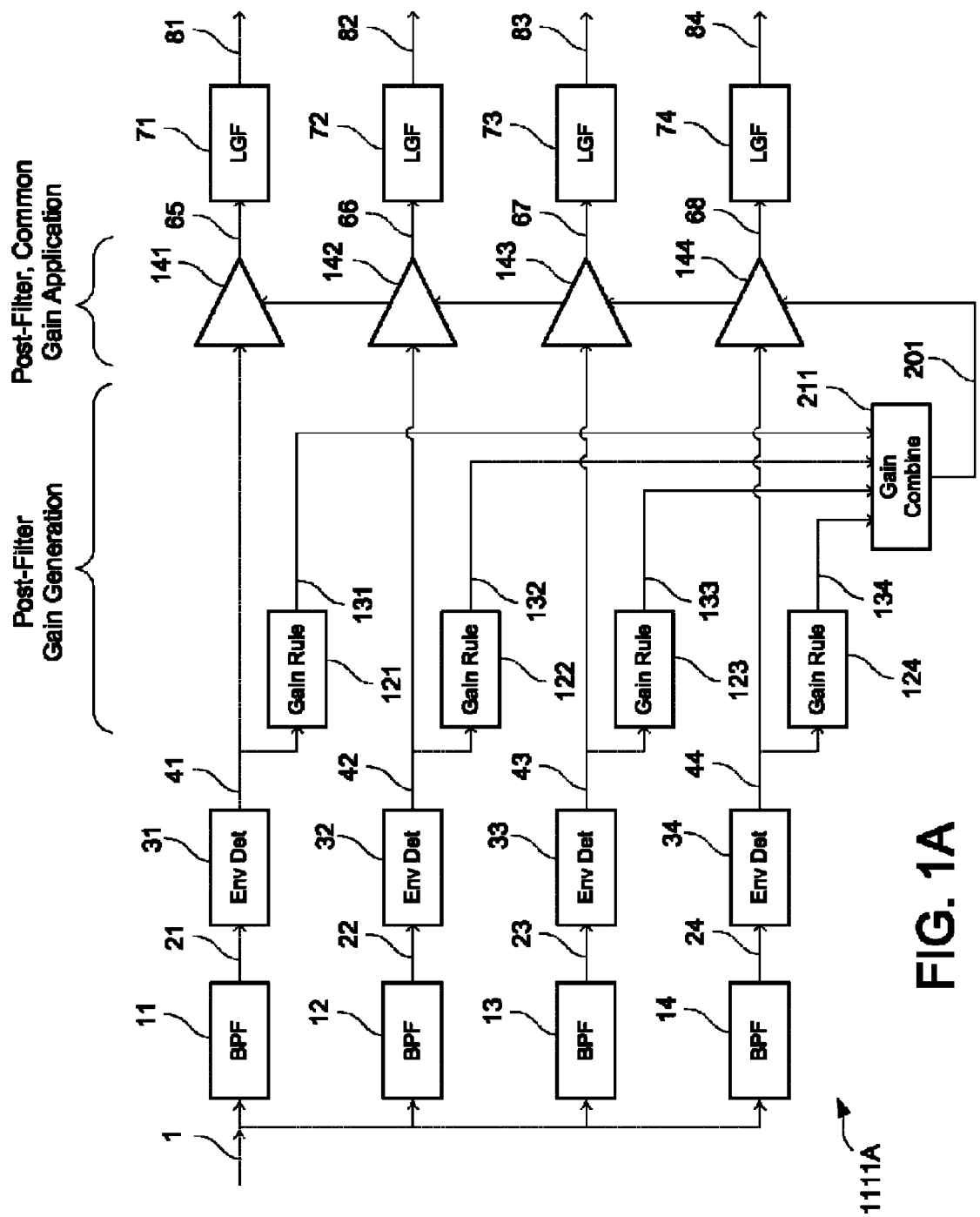
FIG. 1A illustrates a post-filter, common gain determination type of automatic gain control system, according to an embodiment of the present invention.

A post-filter, common gain determination type of automatic gain control (AGC) system 1111A, according to an embodiment of the present invention, is shown in FIG. 1A. For simplicity of illustration, only four bands are shown in FIG. 1A, but a higher number of bands is contemplated, e.g., 22 bands. Audio signal 1 is split into four frequency bands by four band-pass filters (BPFs) 11-14 (or, in other words, collectively, a frequency analysis unit). Each BPF passes a different band of frequencies. BPF outputs 21-24 are applied to amplitude detectors 31-34, e.g., envelope detectors, to produce provisional amplitudes, e.g., provisional envelopes, 41-44. Other examples of amplitude detectors include: full-wave rectifiers; half-wave rectifiers; peak detectors; quadrature envelope detection; etc. Provisional envelopes 41-44 are applied to gain rules 121-124 to generate provisional gains 131-134. Provisional envelopes 41-44 also are applied to amplifiers 141-144 where they are adjusted so as to generate adjusted amplitudes, e.g., adjusted envelopes, 65-68. Adjusted envelopes 65-68 are applied to loudness growth function (LGF) blocks 71-74 (or, in other words, a plurality of translation units) to produce magnitude signals 81-84.

The components of system 1111A can be discrete components or can be functional blocks implemented by, for example, a programmable processor, e.g., a digital signal processor (DSP). In the latter circumstance, e.g., filters 11-14 can be implemented by the processor performing a Fast Fourier Transformation (FFT) upon audio signal 1. Another embodiment uses a quadrature pair of BPFs in each band, followed by quadrature envelope detection to produce the envelopes.

The bands have their own gain rules 121-124, and produce their own provisional gains 131-134, respectively. Rather than applying each of provisional gains 131-134 to its corresponding one of amplifiers 141-144, respectively, as in the Related Art, i.e., using a band-specific gain technique, system 1111A applies one common gain 201 to amplifiers 141-144. This common gain 201 can be calculated by a Gain Combine block 211 based upon provisional gains 131-134. An advantage of the common gain technique over the band-specific gain technique is that the spectral profile is better preserved.

More particularly, according to the band-specific gain technique, the AGC system on each frequency band operates independently of the AGC systems for the other bands. The band-specific gain technique is commonly used in hearing aids. For a hearing-aid wearer, hearing loss often varies with frequency, and thus it can be beneficial to apply differing amounts of compression in different frequency bands. However, for an AGC system that uses multiple bands, such a benefit is outweighed by the following drawback: because less gain is applied to intense bands than is applied to weak bands, the band-specific gain technique tends to reduce the amplitude of spectral peaks relative to spectral valleys, i.e., it flattens the spectral profile, which can degrade speech intelligibility. As an example, for a compression ratio of 4 or greater, speech intelligibility degrades as the number of channels is increased. See, e.g., the article by Plomp R (1994) "Noise, amplification, and compression: considerations of three main issues in hearing aid design," Ear & Hearing 15: 2-12. Plomp recommended using 2 to 4 channels, with a compression ratio of 2. Applying an AGC system using the band-specific gain technique AGC system with infinite compression to a cochlear implant system with, e.g., 22 channels would be expected to give very poor speech intelligibility. By contrast, the common gain technique applies the same gain to intense bands as is applied to weak bands, which avoids flattening the spectral profile, i.e., which better preserves the spectral profile, and so achieves relatively better speech intelligibility.

Operation of system 1111A can be described as filters 11-14 performing a frequency analysis to decompose audio signal 1 into analysis signals 21-24 contained in frequency bands, respectively. Envelope detectors 31-34 produce provisional envelopes 41-44 based upon analysis signals 21-24, respectively. Provisional gains 131-134 are generated by gain rules 121-124 based upon provisional envelopes 41-44, respectively. A common gain is determined by gain combine block 211 based upon provisional gains 131-134. And the updated common gain 201 is applied to provisional envelopes 41-44 by amplifiers 141-144 to produce adjusted envelopes 65-68.

In one embodiment, Gain Combine block 211 calculates the minimum of the provisional gains 131-134. In another embodiment, the Gain Combine block 211 calculates the median of the provisional gains 131-134. In another embodiment, the Gain Combine block 211 calculates the weighted mean of the provisional gains 131-134. All bands may be given equal weight, or alternatively different weights may be applied to different bands. For example, more weight may be given to bands that are more important for speech intelligibility. FIG. 1A can be summarized as illustrating post-filter gain generation and a post-filter application of a common gain.

Figure 1B:
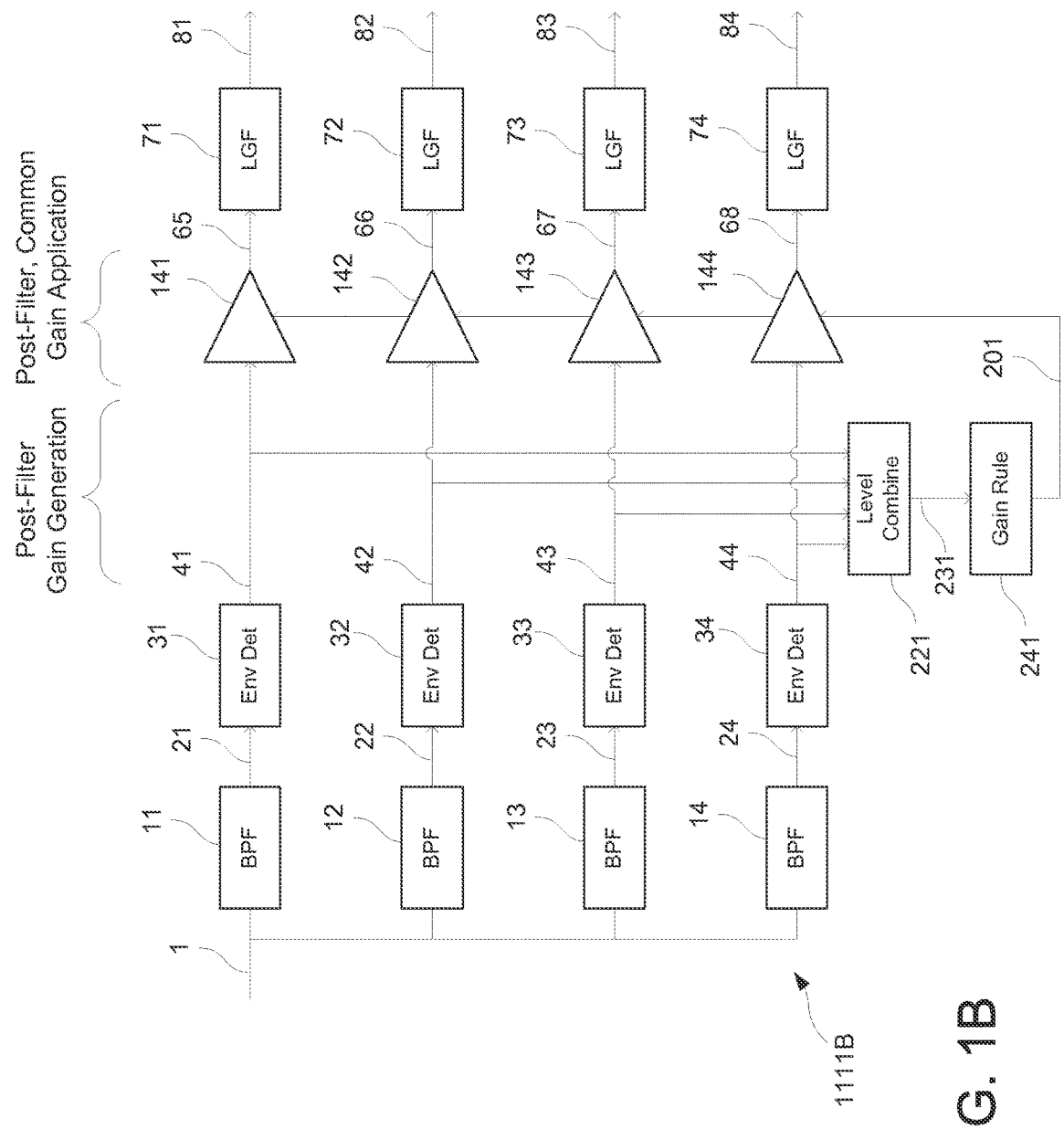
FIG. 1B illustrates another post-filter, common gain determination type of automatic gain control system, according to an embodiment of the present invention.

Another post-filter, common gain determination type of automatic gain control (AGC) system 1111B, according to an embodiment of the present invention, is shown in FIG. 1B. In contrast to system 1111A, system 1111B has a single gain rule 241, which is common to all bands. Provisional amplitudes, e.g., provisional envelopes, 41-44 are applied to Level Combine block 221, which determines a single level 231. Level 231 is applied to Gain Rule 241, to produce common gain 201. In one embodiment, Level Combine block 221 calculates the maximum of the individual envelopes 41-44. In yet another embodiment, Level Combine block 221 calculates the median of the individual provisional envelopes 41-44. In another embodiment, Level Combine block 221 calculates the weighted mean of the individual provisional envelopes 41-44. All bands may be given equal weight, or alternatively different weights may be applied to different bands. For example, more weight may be given to bands that are more important for speech intelligibility. FIG. 1B can be summarized as illustrating post-filter gain generation and a post-filter application of a common gain.

Figure 1C:
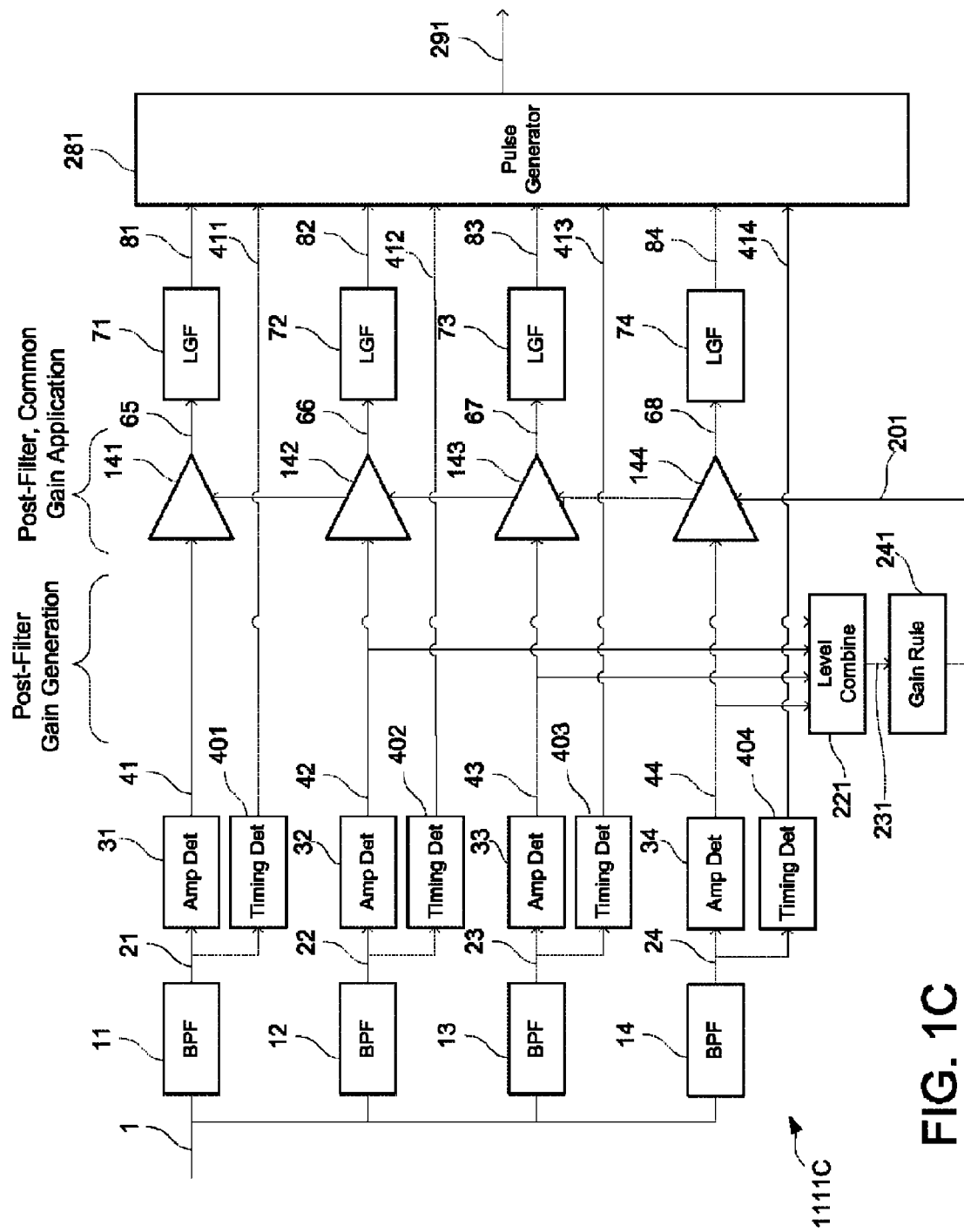
FIG. 1C illustrates another post-filter, common gain determination type of automatic gain control system, according to an embodiment of the present invention.

FIG. 1C illustrates another post-filter, common gain determination type of AGC system 1111C according to an embodiment of the present invention. System 1111C incorporates temporal fine structure (e.g., which may improve prove pitch perception) in addition to post-filter gain generation and application of a common gain as in system 1111B of FIG. 1B. Likewise FIG. 1C can be summarized as illustrating post-filter gain generation and a post-filter application of a common gain.

In FIG. 1C, system 1111C is shown as a four-band system for simplicity of illustration, but a higher number of bands (for example 22) is more typical. In comparison to system 1111B, the BPF outputs 21-24 are processed on two paths: an amplitude path and a timing path. The amplitude path comprises Amplitude Detectors 31-34 and LGF blocks 71-74 and is similar to the processing in system 1111B. The timing path comprises Timing Detectors 401-403, which generate timing signals 411-414. Pulse Generator 281 uses both magnitude signals 81-84 and timing signals 411-414 to generate the stimulation pulse data 291. Generally, the magnitude signals 81-84 determine the current levels of the stimulation pulses.

Figure 1D:
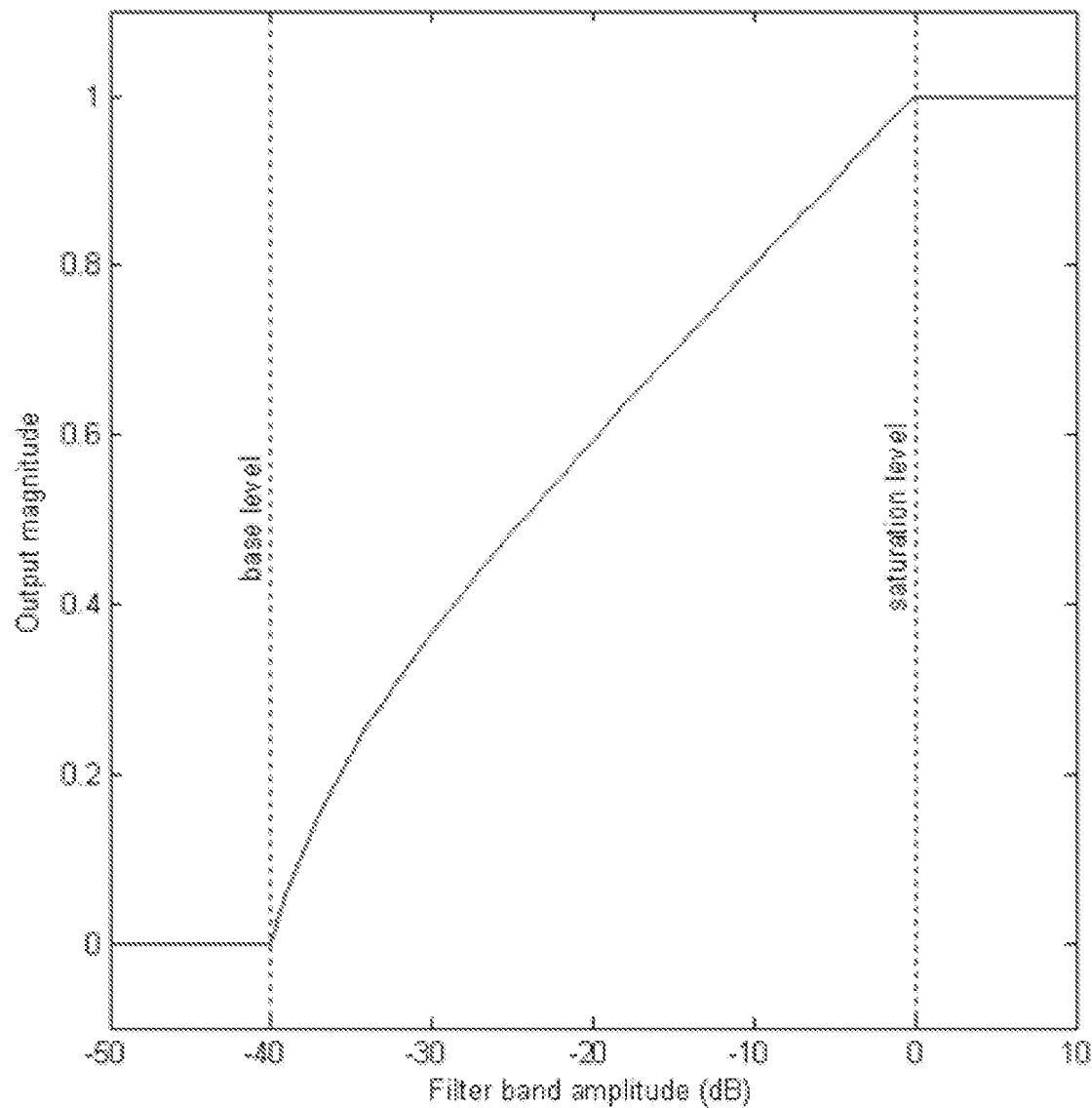
FIG. 1D illustrates an example plot of a transfer function that represents a Loudness Growth Function (LGF)

The LGF blocks 71-74 of FIGS. 1A-1C perform instantaneous non-linear compression. Generally a logarithmic or power-law transfer function is used. FIG. 1D illustrates an example of a non-linear compression transfer function that can be used to implement the LGF blocks 71-74. In FIG. 1D, amplitudes equal to a specified saturation level are mapped to magnitude value of 1.0, which will result in C-level stimulation. The saturation level is often taken as a reference point, e.g., labeled as 0 dB. Envelope amplitudes greater than the saturation level are clipped to magnitude value 1.0. Envelope amplitudes equal to a specified base level are mapped to magnitude value 0.0, which will result in T-level stimulation. The dynamic range is defined as the ratio of the saturation level to the base level. Typical dynamic range values are from 30 to 50 dB; FIG. 1D shows a dynamic range, e.g., of 40 dB.

The LGF blocks 71-74 reduce (if not prevent) excessive loudness by limiting the current on a channel to C-level. However, if the amplitudes provided to the LGF are permitted to exceed the saturation level, then clipping occurs. Clipping has undesirable effects that include the following. Firstly, it can distort the temporal waveform of the envelopes, reducing modulation depth. Secondly, as the channel with largest amplitude will clip first, it can reduce the ratio of the spectral peaks to the spectral valleys, flattening the spectral profile and distorting formant patterns. Thirdly, in the presence of background noise, the speech signal will tend to clip more often than the noise, reducing the effective signal-to-noise ratio (SNR). Clipping can be reduced (if not minimized) by, e.g., appropriate configuration of the Gain Rule, as discussed below.

Figure 2A:
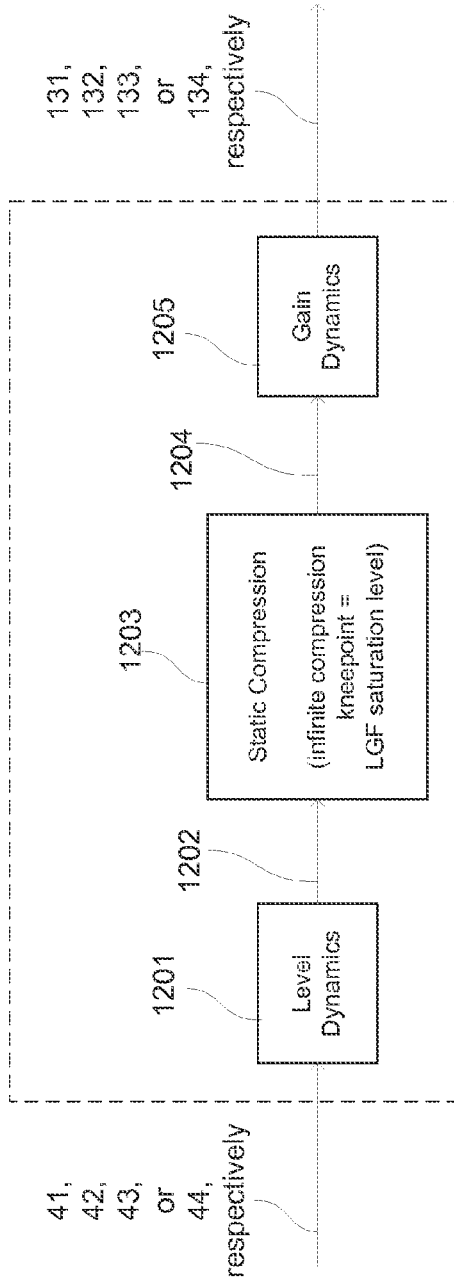
FIG. 2A illustrates Gain Rules, e.g., of FIG. 1A, in more detail, according to an embodiment of the present invention.
Figure 2B:
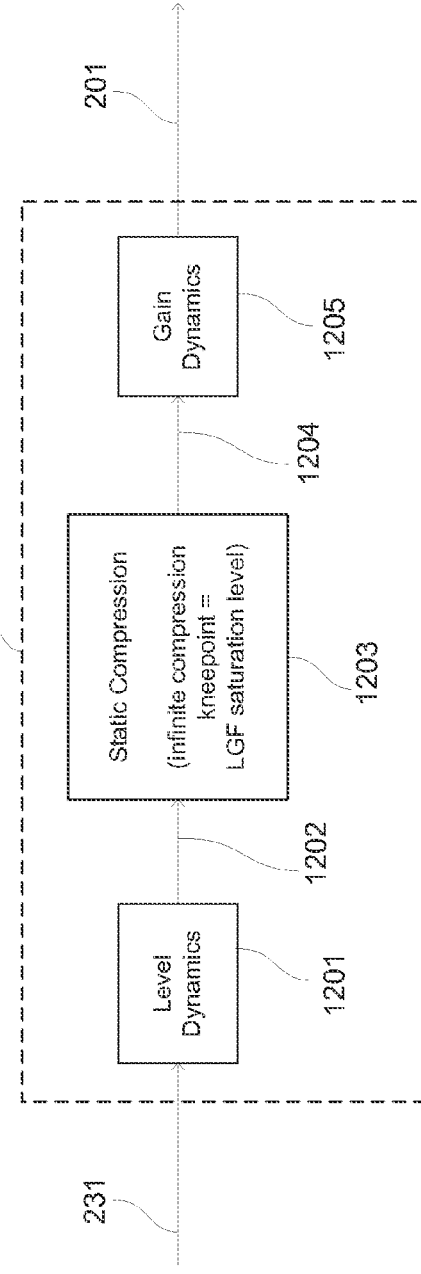
FIG. 2B illustrates the Gain Rule, e.g., of FIGS. 1B-1C and 4A in more detail, according to an embodiment of the present invention.

Gain Rules 121-124 in FIG. 1A and common Gain Rule 241 in FIGS. 1B-1C can be configured, e.g., with similar (or the same) internal architectures. FIG. 2A shows each of gain rules 121-124 in more detail, according to another embodiment of the present invention. For example, in terms of gain rule 121, FIG. 2A illustrates provisional amplitude 41 as the input signal (which is provided to Level Dynamics bock 1201) and provisional gain 131 as the output signal. FIG. 2B shows common Gain rule 241 in more detail, according to another embodiment of the present invention. The input signal (41, 42, 43, 44 or 231, respectively) is applied to a Level Dynamics block 1201 to generate a processed level 1202. A Static Compression block 1203 uses processed level 1202 to determine a raw gain 1204, which is further processed by a Gain Dynamics block 1205 to produce the output gain (131, 123, 133, 134 or 201, respectively).

Figure 2C:
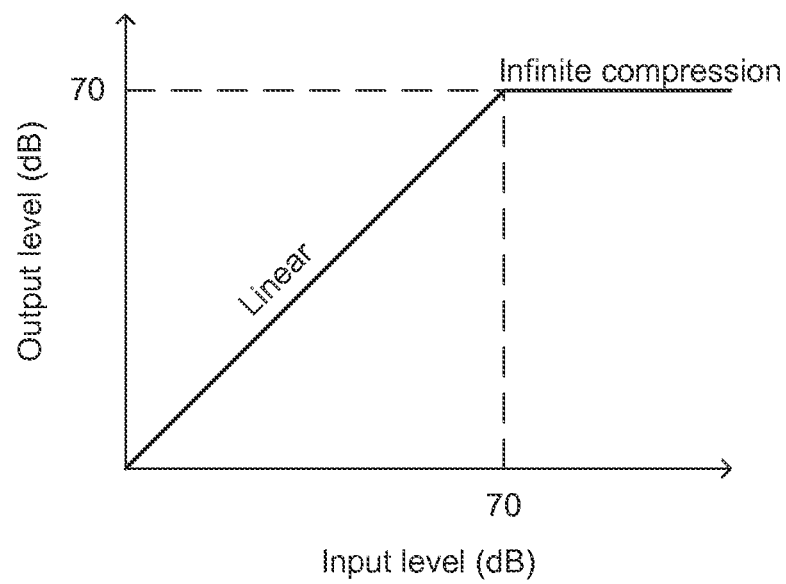
FIGS. 2C-2D illustrate continuous piece-wise linear, input-output functions that represent different examples of the operation of the Static Compression blocks of FIGS. 12A-12B.
Figure 2D:
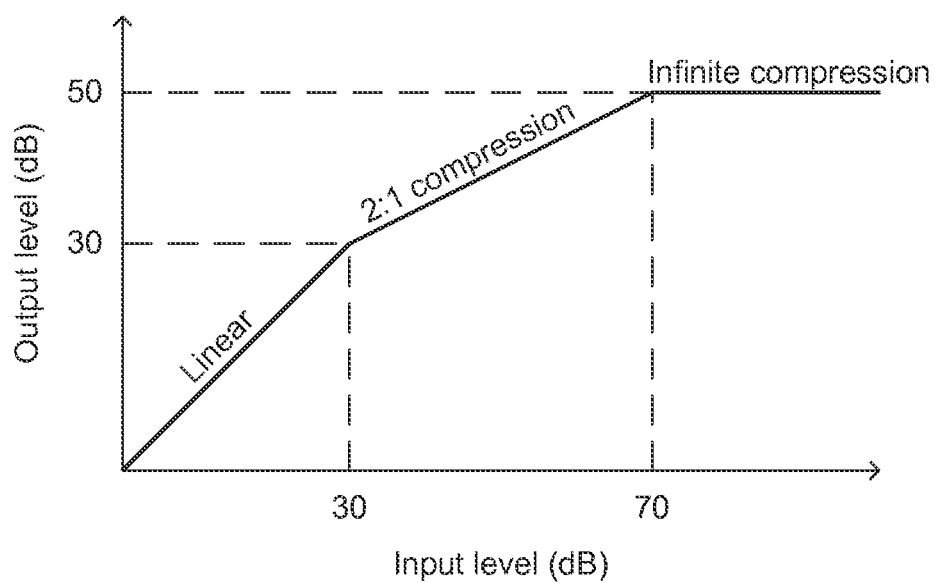

The operation of the Static Compression block 1203 can be described by an input-output function. The input-output function can be, e.g., a continuous piece-wise linear function, specified by two or more compression ratios and a corresponding number of knee points. Examples of continuous, piece-wise linear input-output functions that can be used to implement Static Compression block 1203 are illustrated in FIGS. 2C-2D. The compression ratio can be defined, e.g., as the change in input level that produces a 1 dB change in output level, i.e., the reciprocal of slope of the input-output function. In FIG. 2C, for input levels up to a knee-point of 70 dB, the output level is the same as the input level. This region has a compression ratio of 1, i.e., linear amplification. For input levels above 70 dB, the output level remains at 70 dB, which is the maximum output level of the embodiment reflected in FIG. 2C. This region has infinite (or substantially infinite) compression, hence the corresponding knee-point in this embodiment may be referred to as an infinite compression knee-point. FIG. 12D is an example of an input-output function with two knee-points. For input levels up to a first knee-point of 30 dB, the output level is the same as the input level. For input levels in the range 30 dB up to a second knee-point of 70 dB, the output level grows half as much as the input level. This region has a compression ratio of 2 (i.e., 2:1 compression). For input levels above 70 dB, the output level remains at 50 dB, which is the maximum output level of the embodiment reflected in FIG. 2D. Unlike conventional gain rules, static compression block 1203 in each of FIGS. 2A-2B is configured with a maximum output level equal to the LGF saturation level. This reduces, if not eliminates, clipping in LGF blocks 71-74. In some embodiments, e.g., the embodiment reflected in FIG. 2C, the infinite compression knee point is equal to the maximum output level. In other embodiments, e.g., the embodiment reflected in FIG. 2D, it is not.

An embodiment of Level Combine block 221 and Gain Rule 241 can be summarized as:
 Level Combine: maximum level.
 Static Compression: linear amplification up to a knee-point equal to the LGF saturation level, then infinite compression for higher levels.
 Level Dynamics: none, i.e. zero attack time.
 Gain Dynamics: a hold time of 200 ms, followed by a release period where the gain increases at a constant slew-rate of 40 dB per second.

An example of MATLAB code that can be used to implement Level Combine block 221 and Gain Rule 241 is:

```
%% Initialization:
% Configuration parameters:
sample_ rate= 1 000; %Hz
saturation _level= 1.0;
slew_ rate = 40; % dB/sec
hold time = 0.2;% seconds
max_gain = 1.0;
%% Parameter calculations:
step_ dB = slew _rate I sample rate;
scaler = 10^(step_dB/20);
hold_ count= hold_ time * sample rate;
% State variables:
gain= max _gain;
held=0;
%Processing:
%Level Combine:
largest_ env =max( envelopes);
%Gain rule:
```

```
    raw _gain= saturation _level I largest_ env;
    if raw _gain< gain
    %Attack
        gain= raw _gain;
        held= 0; % Start hold timer
    else
        held= held+ 1;
        if held> hold count
        %Release
            gain = gain * scaler;
        else
        %Hold
        end
    end
    gain= min( max _gain,gain);
```

A benefit of at least some embodiments of the present invention is shown by the contrast between FIG. 3A (representative of Related Art) vis-a-vis FIG. 3B (representative of an embodiment of the present invention), and by the contrast between FIG. 3C (representative of Related Art) vis-a-vis FIG. 3D (representative of an embodiment of the present invention). Here, for example, an audio signal in the form of a sentence in the presence of background noise is considered albeit for 22 bands, not merely 4 bands. FIGS. 3A (Related Art) and 3B (present embodiment) show a 0.6 second segment of the temporal waveform at the output of the LGF, e.g., for channel 4 (centered at 625 Hz), of a 22-channel system. Related Art FIG. 3A shows the LGF output signal 1302 for a Related Art system 100 utilizing a pre-filter gain determination type of AGC. In Related Art FIG. 3A, as called out by reference 1304, the signal 1302 is clipped over the time interval of approximately 0.33 to 0.39 seconds. FIG. 3B, by contrast, shows the corresponding output signal 1306 according to an embodiment of the present invention, e.g., systems 1111A and 1111B. As indicated by reference 1308, no clipping occurs. Relative to Related Art FIG. 3A, FIG. 3B (present embodiment) shows that more of the amplitude modulation, which is a cue to the voice pitch, is preserved.

FIGS. 3C (representative of Related Art) and 3D (representative of an embodiment of the present invention) extend the examples of FIGS. 3A-3B by showing spectral profiles 1310 and 1312 at the output of the LGF blocks, respectively, albeit for the 22 channels, e.g., at the time 0.36 seconds approximately. In FIG. 3D, the spectral profile 1312 shows at most that one channel (in this case channel 6) reaches magnitude 1.0 and produces stimulation at C-level on the corresponding electrode. This gives a clearer indication of the first formant frequency (the first peak at channel 6 in the spectral profile 1312). In contrast, the spectral profile 1310 of FIG. 3C (which, again, is produced by a pre-filter gain determination type of AGC system according to the Related Art) shows that clipping occurs for channels 4, 5, 6, and 7, i.e., those four channels have the maximum magnitude (1.0) resulting in stimulation at C-level on the corresponding electrodes. But for the clipping, a peak would be apparent on one of channels 4-7. Due to the clipping, however, it is unclear which one of the channels 4-7 has the peak; consequently, the frequency of the first formant cannot be accurately determined from the spectral profile 1310. Relative to Related Art FIG. 3C, FIG. 3D (present embodiment) shows improved speech intelligibility.

Figure 4A:
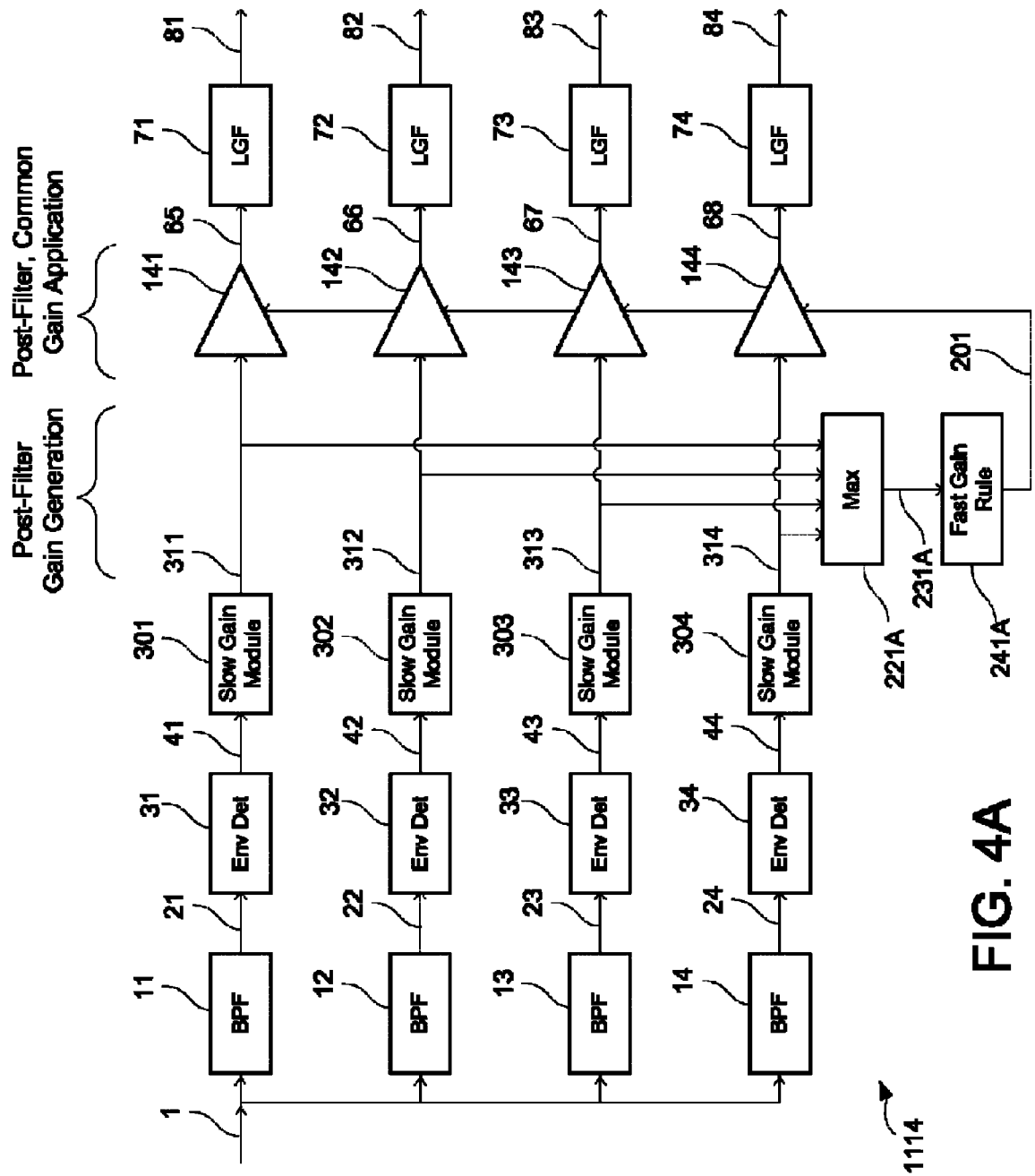
FIG. 4A illustrates another post-filter, common gain determination type of automatic gain control system, according to an embodiment of the present invention.

Another embodiment, according to the present invention, of a post-filter, common gain determination type of AGC system 1114 is shown in FIG. 4A. In this arrangement, provisional amplitudes, e.g., envelopes, 41-44 are processed by Slow Gain Modules 301-304 to produce processed amplitudes, e.g., envelopes, 311-314. A Level Combine block 221A receives processed envelopes 311-314, determines a maximum one thereof, and outputs the maximum as level 231A to a Fast Gain rule 241A, which then produces common gain 201. Fast Gain Rule 241 is implemented, e.g., as in the MATLAB code listed above. Slow Gain Modules 301-304 act independently. A purpose of Slow Gain Modules 301-304 is to help transition from one environment to the next, e.g., to compensate for differences in environment, such as between one talker and another talker, or between a quiet room and a noisy street. This is sometimes known as an automatic volume control (AVC). FIG. 4A can be summarized as illustrating post-filter gain generation and a post-filter application of a common gain.

Figure 4B:
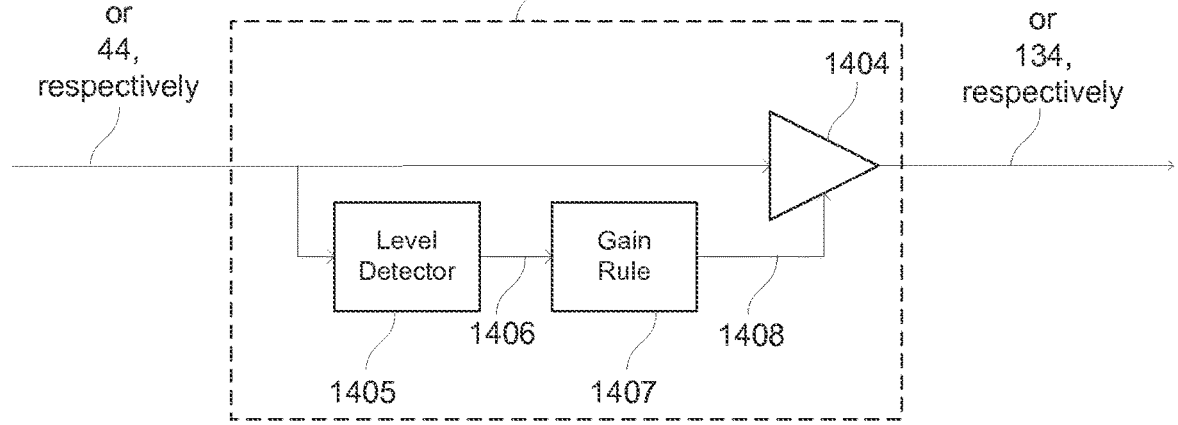
FIG. 4B illustrates the Slow Gain rules of FIG. 4A, in more detail.

Slow Gain Modules 301-304 can be configured with similar (or the same) internal architectures. FIG. 4B shows each of Slow Gain Modules 301-304 in more detail. The input signal (41, 42, 43 or 44, respectively) is applied to a variable-gain amplifier 1404 to produce the processed amplitudes (311, 312, 313 or 314, respectively). This operation is equivalent to multiplying the input signal by a gain 408. A level detector 1405 produces a signal 1406, which represents the level of the input signal. Generally, the level detector 1405 rectifies and smoothes the input signal. A gain rule 1407 uses signal 1406 to determine the gain 1408. Alternatively, the Slow Gain Modules can be implemented using, e.g., the Adaptive Dynamic Range Optimization (ADRO) technique, as disclosed in U.S. Pat. No. 6,731,767 B1 by Blarney et al.

The time taken for an AGC system to respond to an increase in input level is called the attack time. The time taken for an AGC system to respond to a subsequent decrease in input level is called the release time. Typical settings for a "fast" AGC are an attack time in the range of 2 to 5 ms, and a release time in the range 7 5 to 300 ms. The attack and release times should be selected so that the gain changes are small over the course of a sentence. Suitable attack times are in the range 0.5-1 second, and suitable release times are in the range 1-2 seconds.

Figure 5:
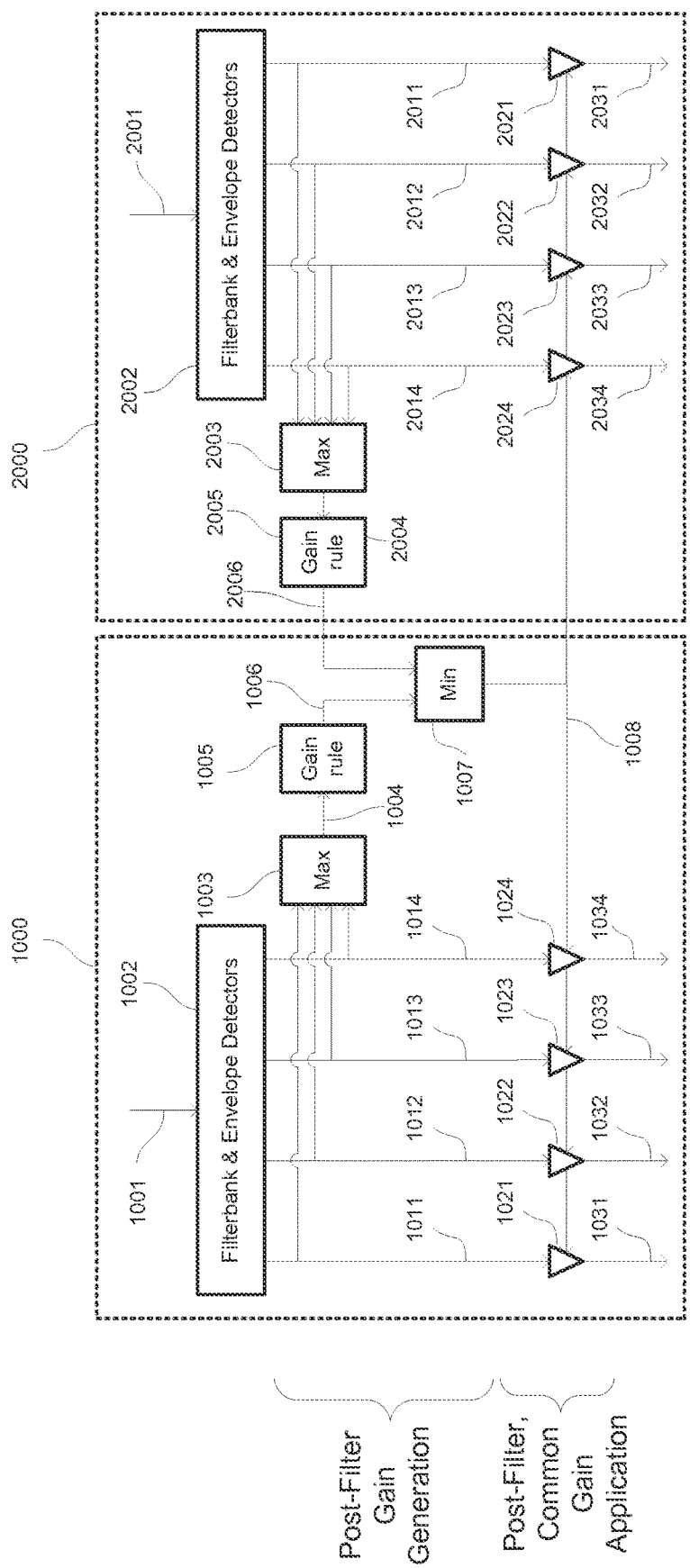
FIG. 5 shows post-filter, common gain determination type of automatic gain control systems for a bilateral cochlear implant system, according to another embodiment of the present invention.

FIG. 5 shows post-filter, common gain determination type of automatic gain control systems 1000 and 2000 for a bilateral cochlear implant system 1115, according to another embodiment of the present invention. The bilateral system contains two systems, 1000 and 2000, which will be referred to as Left system 1000 and Right system 2000. Each system is similar to system 1111B, except that Left gain 1006 and Right gain 2006 are provided, e.g., to a minimum (Min) block 1007 in Left system 1000, which calculates common gain 1008 as the minimum of Left gain and Right gain 2006 at each instant in time. Alternatively, Min block 2007 can be provided in Right system 2000. Common gain 1008 is applied to both Left amplifiers 1021-1024 and Right amplifiers 2021-2024. Each Gain Rule (1005, 2005) has a maximum output level equal to the LGF saturation level. FIG. 5 can be summarized as illustrating post-filter gain generation and a post-filter application of a common gain.

Figure 6:
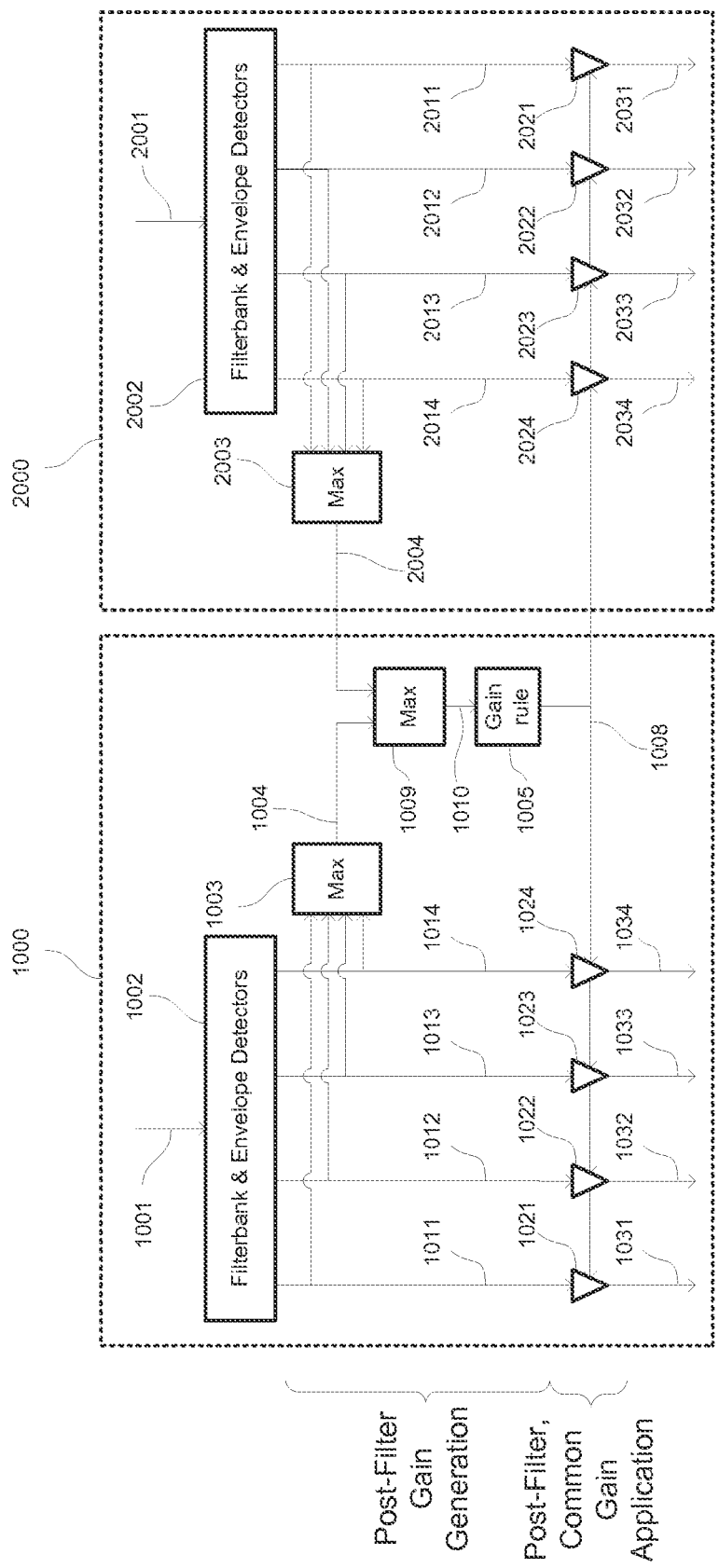
FIG. 6 shows post-filter, common gain determination type of automatic gain control systems for another bilateral cochlear implant system, according to another embodiment of the present invention.

FIG. 6 shows post-filter, common gain determination type of automatic gain control systems 1000' and 2000' for another bilateral cochlear implant system 1116, according to an embodiment of the present invention. Systems 1000' and 2000' are similar to systems 1000 and 2000 of FIG. 5, respectively, except that Left maximum envelope 1004 and Right maximum envelope 2004 are provided to a maximum (Max) block 1009, which calculates the overall maximum envelope 1010. This is used by Gain Rule 1005 to generate common gain 1008, which is applied to both left amplifiers 1021-1024 and Right amplifiers 2021-2024. In FIG. 6, Max block 1009 and Gain Rule 1005 are illustrated as being included within Left system 1000'; alternatively, provided in Max block 1009 and Gain Rule 1005 can be provided in Right system 2000'. FIG. 6 can be summarized as illustrating post-filter gain generation and a post-filter application of a common gain.

A benefit of bilateral hearing is the ability to localize sound. One cue that is used in localization is the interaural-level difference (ILD). For example, a sound coming from the left side will have a greater intensity at the left ear than the right ear. Disadvantages of clipping in AGC systems, e.g., 1111B, have been discussed above. In the context of bilateral cochlear implant systems, clipping has further disadvantages. If clipping occurs on one or both sides, then the ILD cue is reduced or destroyed. However, systems 1115 and 1116, like system 1111B, avoid clipping, thereby better preserving the ILD cue and facilitating better sound localization by the recipient.

Figure 7:
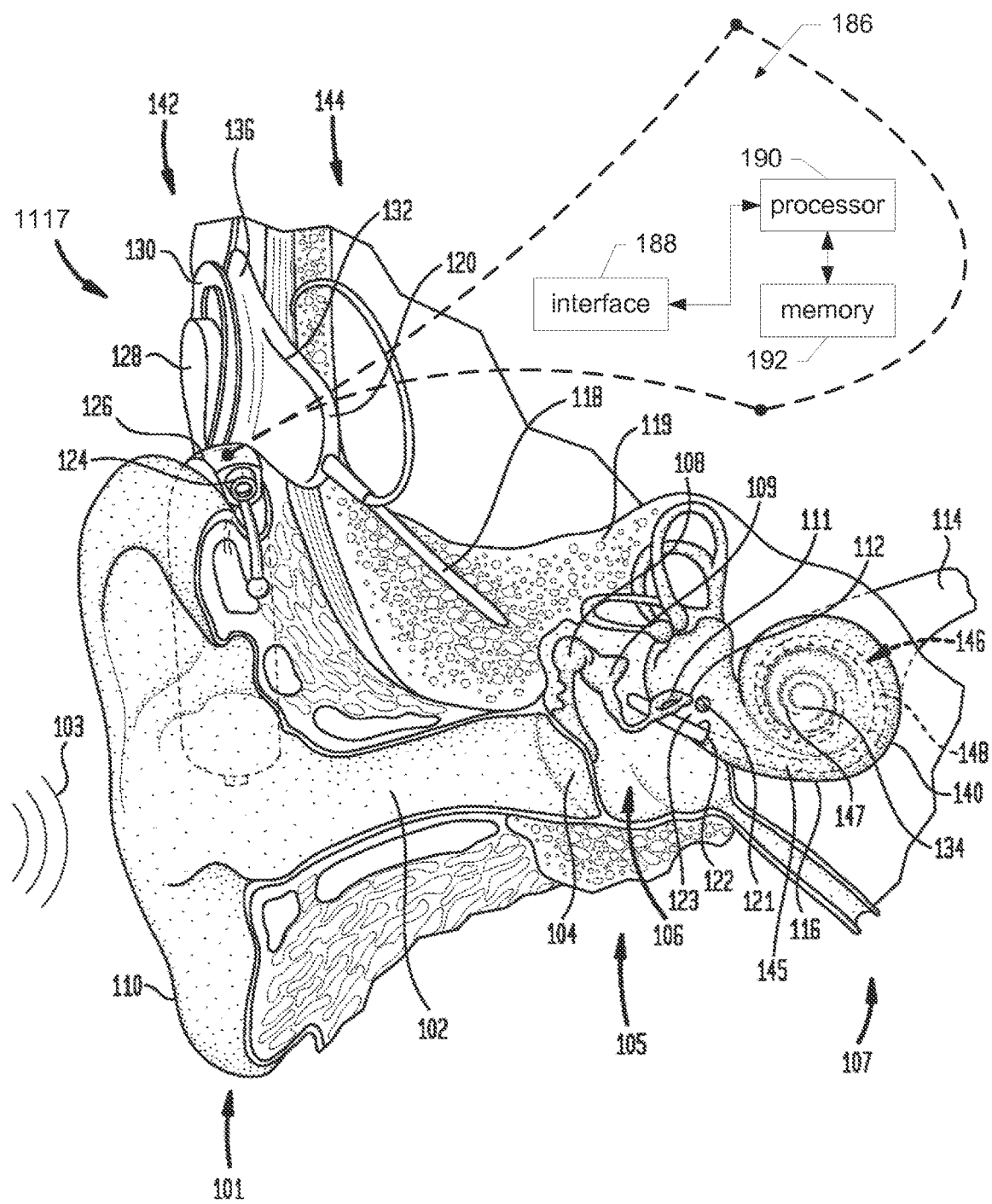
FIG. 7 illustrates a cochlear implant system, according to another embodiment of the present invention.

Some embodiments of the present invention may be implemented in sound processing technologies, for example, hearing prostheses, e.g., cochlear implant systems. FIG. 7 illustrates a perspective view of a cochlear implant system 1117 according to another embodiment of the present invention. System 1117 includes a sound processor module 126 which can include any of gain control systems 1111A, 1111B, 1111C or 1114, or if system 117 is part of a bilateral cochlear implant system, then corresponding portions of gain control systems 1115 or 1116, according to embodiments of the present invention, respectively.

In FIG. 7, cochlear implant system 1117 is illustrated as implanted in a recipient having an outer ear 101, a middle ear 105 and an inner ear 107. Components of outer ear 101, middle ear 105 and inner ear 107 are described below, followed by a description of cochlear implant 100.

In a fully functional ear, outer ear 101 comprises an auricle 110 and an ear canal 102. An acoustic pressure or sound wave 103 is collected by auricle 110 and channeled into and through ear canal 102. Disposed across the distal end of ear cannel 102 is a tympanic membrane 104 which vibrates in response to sound wave 103. This vibration is coupled to oval window or fenestra ovalis 112 through three bones of middle ear 105, collectively referred to as the ossicles 106 and comprising the malleus 108, the incus 109 and the stapes 111. Bones 108, 109 and 111 of middle ear 105 serve to filter and amplify sound wave 103, causing oval window 112 to articulate, or vibrate in response to vibration of tympanic membrane 104. This vibration sets up waves of fluid motion of the perilymph within cochlea 140. Such fluid motion, in turn, activates tiny hair cells (not shown) inside of cochlea 140. Activation of the hair cells causes appropriate nerve impulses to be generated and transferred through the spiral ganglion cells (not shown) and auditory nerve 114 to the brain (also not shown) where they are perceived as sound.

Cochlear implant 100 comprises an external component 142 which is directly or indirectly attached to the body of the recipient, and an internal or implantable component 144 which is temporarily or permanently implanted in the recipient. External component 142 typically comprises one or more sound input elements, such as microphone 124 for detecting sound, a sound processing unit 126, a power source (not shown), and an external transmitter unit 128. External transmitter unit 128 comprises an external coil 130 and, preferably, a magnet (not shown) secured directly or indirectly to external coil 130. Sound processing unit 126 processes the output of microphone 124 that is positioned, in the depicted embodiment, by auricle 110 of the recipient. Sound processing unit 126 generates encoded signals, sometimes referred to herein as encoded data signals, which are provided to external transmitter unit 128 via a cable (not shown). As shown by exploded view 186 in FIG. 7, sound processor module 126 can include a programmable processor 190, e.g., a digital signal processor (DSP), application-specific integrated circuit (ASIC), etc. Processor 190 is operatively coupled to a memory 192, e.g., random access memory (RAM) and/or read-only memory (ROM). Processor 192 also is operatively coupled via interface 188, e.g., to a microphone 124 and external transmitter unit 128.

Internal component 144 comprises an internal receiver unit 132, a stimulator unit 120, and an elongate stimulating lead assembly 118. Internal receiver unit 132 comprises an internal coil 136, and preferably, a magnet (also not shown) fixed relative to the internal coil. Internal receiver unit 132 and stimulator unit 120 are hermetically sealed within a biocompatible housing, sometimes collectively referred to as a stimulator/receiver unit. Internal coil 136 receives power and stimulation data from external coil 130, as noted above. Elongate stimulating lead assembly 118 has a proximal end connected to stimulator unit 120, and extends through mastoid bone 119. Lead assembly 118 has a distal region, referred to as electrode assembly 145, implanted in cochlea 140. As used herein the term "stimulating lead assembly," refers to any device capable of providing stimulation to a recipient, such as, for example, electrical or optical stimulation.

Electrode assembly 145 may be implanted at least in basal region 116 of cochlea 140, and sometimes further. For example, electrode assembly 145 may extend towards apical end of cochlea 140, referred to as cochlea apex 134. Electrode assembly 145 may be inserted into cochlea 140 via a cochleostomy 122, or through round window 121, oval window 112, and the promontory 123 or opening in an apical turn 147 of cochlea 140.

Electrode assembly 145 has disposed therein or thereon a longitudinally aligned and distally extending array 146 of electrode contacts 148, sometimes referred to as electrode array 146 herein. Throughout this description, the term "electrode array" means a collection of two or more electrode contacts, sometimes referred to simply as contacts herein. As would be appreciated, electrode array 146 may be disposed on electrode assembly 145. However, in most practical applications, electrode array 146 is integrated into electrode assembly 145. As used herein, electrode contacts or other elements disposed in a carrier refer to elements integrated in, or positioned on, the carrier member. As such, electrode array 146 is referred to herein as being disposed in electrode assembly 145. Stimulator unit 120 generates stimulation signals which are applied by electrodes 148 to cochlea 140, thereby stimulating auditory nerve 114.

In cochlear implant 100, external coil 130 transmits electrical signals (i.e., power and stimulation data) to internal coil 136 via a radio frequency (RF) link. Internal coil 136 is typically a wire antenna coil comprised of multiple turns of electrically insulated single-strand or multi-strand platinum or gold wire. The electrical insulation of internal coil 136 is provided by a flexible silicone molding (not shown). In use, implantable receiver unit 132 may be positioned in a recess of the temporal bone adjacent auricle 110 of the recipient.

As noted, FIG. 7 illustrates specific embodiments of the present invention in which cochlear implant 100 includes an external component 142. It would be appreciated that in alternative embodiments, cochlear implant 100 comprises a totally implantable prosthesis that is capable of operating, at least for a period of time, without the need of an external component. In such embodiments, all components of cochlear implant 100 are implantable, and the cochlear implant operates in conjunction with external component 142.

Some embodiments of the present invention are described herein in connection with a type of Active Implantable Medical Device (AIMD), namely a cochlear implant system. It should be appreciated that embodiments of the present invention may be implemented in other sound-processing technologies that benefit from gain control systems, e.g., telecommunications, and the like.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

Reference herein to "one embodiment" or "an embodiment" means that a particular feature, structure, operation, or other characteristic described in connection with the embodiment may be included in at least one implementation of the present invention. However, the appearance of the phrase "in one embodiment" or "in an embodiment" in various places in the specification does not necessarily refer to the same embodiment. It is further envisioned that a skilled person could use any or all of the above embodiments in any compatible combination or permutation.

While various embodiments of the present invention have been described above, it should be understood that they have been presented by way of example only, and not limitation. It will be apparent to persons skilled in the relevant art that various changes in form and detail may be made therein without departing from the scope of the present invention. Thus, the breadth and scope of the present invention should not be limited by any of the above-described exemplary embodiments, but should be defined only in accordance with the following claims and their equivalents.

What is claimed is:

1. An apparatus, comprising:
a frequency analysis unit configured to decompose a sound signal into a plurality of sub-signals each associated with a specific frequency band of the sound signal;
amplitude detection circuits configured to produce provisional amplitudes for each of the sub-signals;
gain circuitry configured to determine a common gain based on the provisional amplitudes; and
an amplification module configured to generate a plurality of adjusted amplitudes by adjusting the amplification of all of the provisional amplitudes based on the common gain.

2. The apparatus of claim 1, wherein the gain circuitry is configured to:
generate, in accordance with a plurality of gain rules each selected for one of the frequency bands, provisional gains for each of the provisional amplitudes; and
determine the common gain based on the provisional gains.

3. The apparatus of claim 2, wherein to determine the common gain based on the provisional gains, the gain circuitry is configured to determine at least one of a minimum of the provisional gains, a median of the provisional gains, or a weighted mean of the provisional gains.

4. The apparatus of claim 1, wherein the gain circuitry comprises:
a level combine circuit configured to analyze the provisional amplitudes and generate a level signal; and
a gain rule circuit configured to generate the common gain based upon the level signal.

5. The apparatus of claim 4, wherein the level combine circuit is configured to:
calculate a maximum of the provisional amplitudes as the level signal.

6. The apparatus of claim 4, wherein the level combine circuit is configured to:
calculate a median of the provisional amplitudes as the level signal.

7. The apparatus of claim 4, wherein the level combine circuit is configured to:
calculate a weighted mean of the provisional amplitudes as the level signal.

8. The apparatus of claim 4, wherein the gain circuitry further comprises:
timing detection circuits configured to determine timing signals according to each of the sub-signals.

9. The apparatus of claim 8, further comprising:
a pulse generator configured to generate stimulation pulse data based upon the adjusted amplitudes and according to the timing signals.

10. The apparatus of claim 1, further comprising:
a plurality of translation units configured to apply loudness growth functions to the plurality of adjusted amplitudes.

11. The apparatus of claim 10, wherein the loudness growth functions have substantially the same saturation levels, and wherein the gain circuitry further comprises static compression circuitry that incorporates an infinite compression region, and a corresponding maximum output level that is substantially equal to the saturation levels of the loudness growth functions.

12. The apparatus of claim 1, wherein the amplification module includes:
a bank of amplifiers configured to adjust the provisional amplitudes based upon the common gain so as to generate the plurality of adjusted amplitudes; and
a bank of translation units configured to apply loudness growth functions to the plurality of adjusted amplitudes.

13. A method comprising:
generating provisional amplitude envelopes for a plurality of sub-signals that each comprise a frequency component of an input sound signal;
generating, based on at least one gain rule, a common gain for application to each of the provisional amplitude envelopes; and
applying the common gain to all of the provisional amplitude envelopes to produce a plurality of adjusted amplitude envelopes.

14. The method of claim 13, wherein generating the common gain based on the at least one gain rule comprises:
applying gain rules to each of the provisional amplitude envelopes to generate a plurality of provisional gains; and
determining the common gain based on the provisional gains.

15. The method of claim 14, wherein determining the common gain based on the provisional gains further includes at least one: selecting a minimum of the provisional gains as the common gain, calculating a median of the provisional gains as the common gain, or calculating a mean of weighted provisional gains.

16. The method of claim 13, wherein generating the common gain based on the based on at least one gain rule comprises:
- generating a level signal based on the provisional amplitude envelopes; and
- generating the common gain based upon the level signal.

17. The method of claim 16, wherein generating the level signal comprises:
- calculating a maximum of the provisional amplitude envelopes as the level signal.

18. The method of claim 16, wherein generating the level signal comprises:
- calculating a median of the provisional amplitude envelopes as the level signal.

19. The method of claim 16, wherein generating the level signal comprises:
- applying weights to the provisional amplitude envelopes to generate weighted amplitude envelopes; and
- calculating a mean of the weighted provisional amplitude envelopes as the level signal.

20. The method of claim 16, wherein the gain circuitry further comprises:
- determining timing signals according to each of the sub-signals.

21. The method of claim 20, further comprising:
- generating stimulation pulse data based upon the adjusted amplitude envelopes and according to the timing signals.

22. The method of claim 13, further comprising:
- applying loudness growth functions to the plurality of adjusted amplitudes amplitude envelopes.

23. The method of claim 13, further comprising:
- prior to generating the provisional amplitude envelopes, performing a frequency analysis to decompose the sound signal into the plurality of sub-signals.

* * * * *